United States Patent
Yu et al.

(10) Patent No.: US 12,543,560 B2
(45) Date of Patent: Feb. 3, 2026

(54) SEMICONDUCTOR STRUCTURE

(71) Applicant: Taiwan Semiconductor Manufacturing Company, Ltd., Hsinchu (TW)

(72) Inventors: Chia-Ta Yu, New Taipei (TW); Kai-Hsuan Lee, Hsinchu (TW); Sai-Hooi Yeong, Zhubei (TW); Yen-Chieh Huang, Tainan (TW); Feng-Cheng Yang, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 370 days.

(21) Appl. No.: 18/358,707

(22) Filed: Jul. 25, 2023

(65) Prior Publication Data

US 2023/0369102 A1    Nov. 16, 2023

Related U.S. Application Data

(62) Division of application No. 17/225,437, filed on Apr. 8, 2021, now Pat. No. 11,735,471.

(51) Int. Cl.
H01L 21/768 (2006.01)
H01L 21/285 (2006.01)
(Continued)

(52) U.S. Cl.
CPC .... *H01L 21/7682* (2013.01); *H01L 21/28518* (2013.01); *H01L 21/76805* (2013.01); *H01L 21/76843* (2013.01); *H01L 21/76865* (2013.01); *H01L 21/76895* (2013.01); *H01L 23/5329* (2013.01); *H01L 23/535* (2013.01);
(Continued)

(58) Field of Classification Search
CPC .......... H01L 21/7682; H01L 21/28518; H01L 21/76805; H01L 21/76843; H01L 21/76865; H01L 21/76895; H01L 23/5329; H01L 23/535; H01L 21/76855; H01L 2221/1063; H01L 21/76883; H01L 21/76825; H10D 30/024; H10D 30/6211; H10D 62/151; H10D 64/62; H10D 30/62; H10D 30/6219; H10D 64/679; H10D 62/115
See application file for complete search history.

(56) References Cited

U.S. PATENT DOCUMENTS 9,443,956 B2 * 9/2016 Yu .......................... H10D 30/62
10,707,120 B1 * 7/2020 Yami ..................... H01L 21/764
(Continued)

*Primary Examiner* — Scott B Geyer
(74) *Attorney, Agent, or Firm* — Birch, Stewart, Kolasch & Birch, LLP

(57) ABSTRACT

A semiconductor structure includes a fin structure formed over a substrate. The structure also includes a gate structure formed across the fin structure. The structure also includes source/drain epitaxial structures formed on opposite sides of the gate structure. The structure also includes an inter-layer dielectric (ILD) structure formed over the gate structure. The structure also includes a contact blocking structure formed through the ILD structure over the source/drain epitaxial structure. A lower portion of the contact blocking structure is surrounded by an air gap, and the air gap is covered by a portion of the ILD structure.

20 Claims, 12 Drawing Sheets

(51) Int. Cl.
*H01L 23/532* (2006.01)
*H01L 23/535* (2006.01)
*H10D 30/01* (2025.01)
*H10D 30/62* (2025.01)
*H10D 62/13* (2025.01)
*H10D 64/62* (2025.01)

(52) U.S. Cl.
CPC ....... *H10D 30/024* (2025.01); *H10D 30/6211* (2025.01); *H10D 62/151* (2025.01); *H10D 64/62* (2025.01)

(56) References Cited

U.S. PATENT DOCUMENTS

| | | | |
|---|---|---|---|
| 2014/0217545 A1* | 8/2014 | Kim | H10B 12/0335 |
| | | | 257/522 |
| 2018/0218975 A1* | 8/2018 | Lee | H01L 21/743 |
| 2019/0296123 A1* | 9/2019 | Lee | H01L 21/7682 |
| 2019/0378909 A1* | 12/2019 | Cheng | H10D 64/679 |
| 2020/0020567 A1* | 1/2020 | Sun | H01L 21/764 |
| 2020/0098857 A1* | 3/2020 | Loechelt | H10D 62/117 |
| 2020/0105867 A1 | 4/2020 | Lee et al. | |
| 2020/0411415 A1* | 12/2020 | Wu | H01L 21/76832 |
| 2021/0066500 A1* | 3/2021 | Liu | H01L 21/7682 |
| 2021/0193505 A1* | 6/2021 | Huang | H01L 21/7682 |
| 2021/0193817 A1* | 6/2021 | Chen | H01L 21/76897 |
| 2021/0313233 A1* | 10/2021 | Lee | H10D 62/115 |
| 2023/0020933 A1* | 1/2023 | Wang | H10D 84/0149 |
| 2023/0402530 A1* | 12/2023 | Zhao | H10D 64/258 |

\* cited by examiner

SEMICONDUCTOR STRUCTURE

PRIORITY CLAIM AND CROSS-REFERENCE

This application is a Divisional application of U.S. patent application Ser. No. 17/225,437, filed on Apr. 8, 2021, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A-3M, 3N-1, 3N-2 are cross-sectional representations of various stages of forming a semiconductor structure, in accordance with some embodiments of the disclosure.

DETAILED DESCRIPTION

Figure 1:
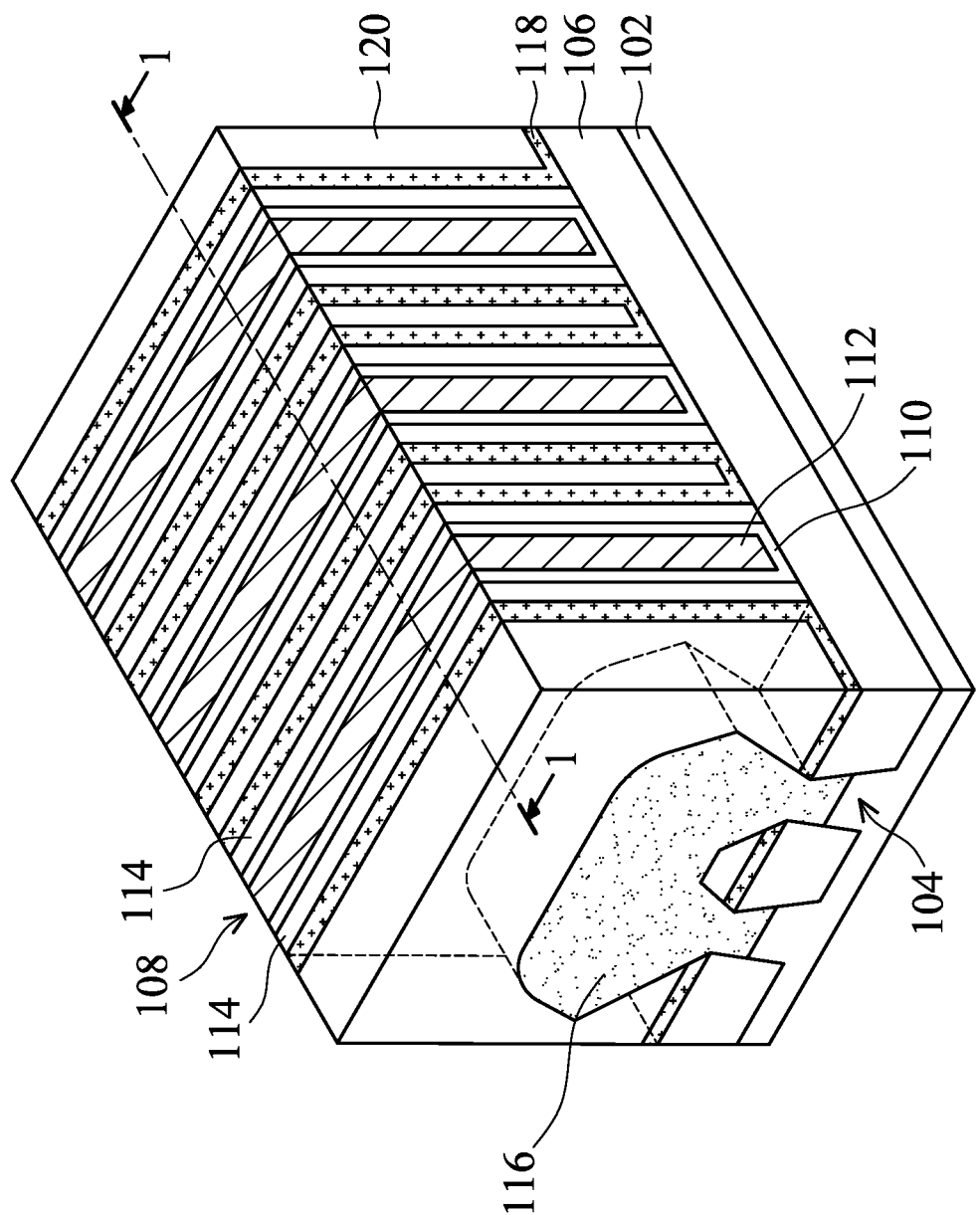
FIG. 1 is a perspective representation of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor structure are provided. The method for forming the semiconductor structure may include forming an air gap between the contact structure and the contact blocking structure. Since the air gap is with lower dielectric constant, the capacitance between the contact structures may be reduced, and circuit speed may be boosted.

Figure 2:
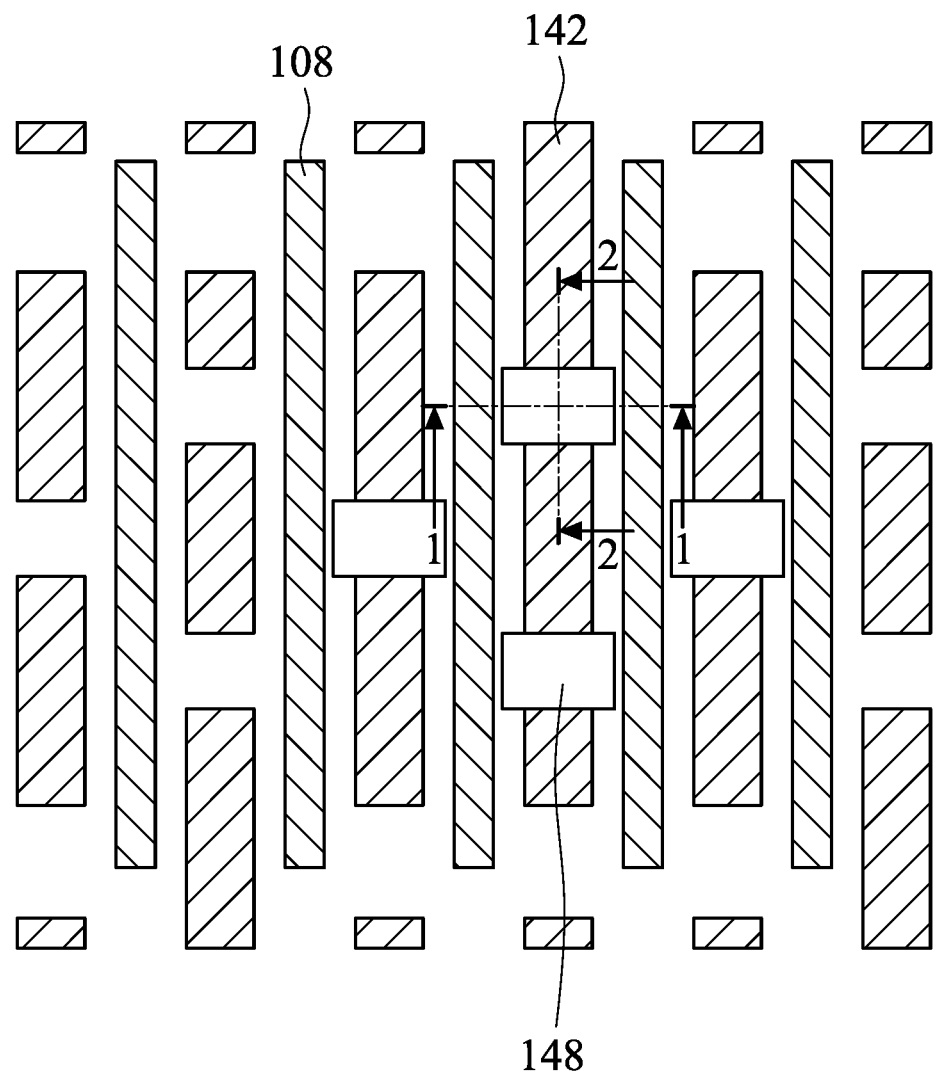
FIG. 2 is a top view of a semiconductor structure, in accordance with some embodiments of the disclosure.

FIG. 1 is a perspective representation of a semiconductor structure 10a, in accordance with some embodiments of the disclosure. FIG. 2 is a top view of the semiconductor structure 10a, in accordance with some embodiments of the disclosure. FIGS. 3A-3M, 3N-1, and 3N-2 are cross-sectional representations of various stages of forming the semiconductor structure 10a, in accordance with some embodiments of the disclosure. FIGS. 3A-3M and 3N-1 show cross-sectional representations taken along line 1-1 in FIGS. 1 and 2. FIG. 3N-2 shows a cross-sectional representation taken along line 2-2 in FIG. 2.

Figure 3A:
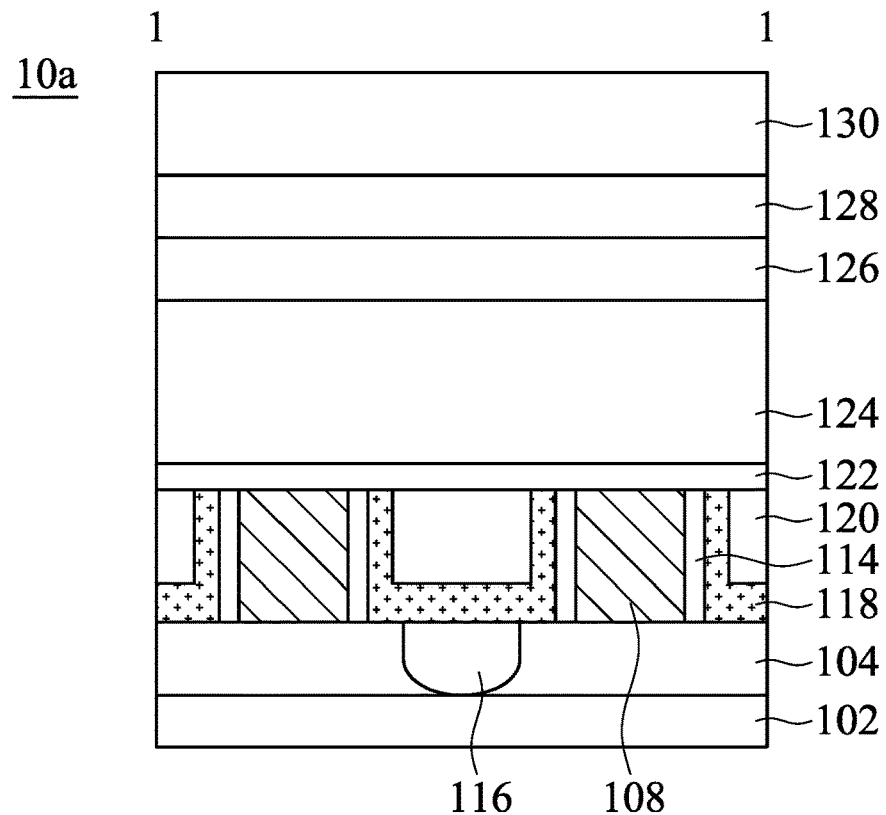

A substrate 102 is provided as shown in FIGS. 1 and 3A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, a pad layer may be blanketly formed over the substrate 102, and a hard mask layer may be blanketly formed over the pad layer (not shown). The pad layer may be a buffer layer between the substrate 102 and the hard mask layer. In addition, the pad layer may be used as a stop layer when the hard mask layer is removed. The pad layer may be made of silicon oxide. The hard mask layer may be made of silicon oxide, silicon nitride, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Afterwards, an etching process is performed on the substrate 102 to form a fin structure 104 by using the hard mask layer as a mask as shown in FIGS. 1 and 3A in accordance with some embodiments. The etching process may be a dry etching process or a wet etching process. In some embodiments, the substrate 102 is etched by a dry etching process. The dry etching process may include using a fluorine-based etchant gas, such as $SF_6$, $C_xF_y$ (where x and y may be positive integers), $NF_3$, or a combination thereof. The etching process may be a time-controlled process, and continue until the fin structure 104 reaches a predetermined height. It should be noted that since the fin structure 104 and the substrate 102 are made of the same material, and there is no obvious interface between them.

Next, a liner layer may be conformally formed on the sidewalls and the top surface of the fin structure 104 (not shown). The liner layer may be used to protect the fin structure 104 from being damaged in the following processes (such as an anneal process or an etching process). In some embodiments, the liner layer is made of silicon nitride.

Next, an isolation layer 106 is formed to cover the fin structure 104 and the substrate 102 as shown in FIG. 1 in accordance with some embodiments, The isolation layer 106 may be made of silicon oxide, silicon nitride, silicon oxynitride, fluoride-doped silicate glass (FSG), or another low-k dielectric material. The isolation layer 106 may be deposited by a deposition process, such as a chemical vapor deposition (CVD) process, a spin-on-glass process, or another applicable process.

Afterwards, the isolation layer 106 may be planarized to expose the top surface of the patterned hard mask layer (not shown). The isolation layer 106 may be planarized by a chemical mechanical polishing (CMP) process. Afterwards, the patterned hard mask layer may be removed. The patterned hard mask layer may be removed by a wet etching process. The wet etching process may include using a phosphoric acid ($H_3PO_4$) etching solution.

Next, an etching process is performed on the isolation layer 106, as shown in FIGS. 1 and 3A in accordance with some embodiments. The etching process may be used to remove a portion of the liner layer and a portion of the isolation layer 106. As a result, the top portion of the fin structure 104 may be exposed and the remaining isolation layer 106 may surround the base portion of the fin structure 104. The remaining isolation layer 106 may be an isolation structure 106 such as a shallow trench isolation (STI) structure surrounding the base portion of the fin structure 104. The isolation structure 106 may be configured to prevent electrical interference or crosstalk.

Next, a gate structure 108 is formed over and across the fin structures 104, as shown in FIGS. 1 and 3A in accordance with some embodiments. The gate structure 108 may include a gate dielectric layer 110 and a gate electrode layer 112. The gate dielectric layer 110 may be a dummy gate dielectric layer and the gate electrode layer 112 may be a dummy gate electrode layer. The dummy gate dielectric layer and the dummy gate electrode layer may be replaced by the following steps to form a real gate structure with a high-k dielectric layer and a metal gate electrode layer.

The gate dielectric layer 110 may include silicon oxide. The silicon oxide may be formed by an oxidation process (e.g., a dry oxidation process, or a wet oxidation process), a chemical vapor deposition process, other applicable processes, or a combination thereof. Alternatively, the gate dielectric layer 110 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The gate electrode layer 112 may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The gate electrode layer 112 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the gate dielectric layer 110 and the gate electrode layer 112 to form the gate structure 108 by using a patterned photoresist layer as a mask (not shown). The etching process may be a dry etching process or a wet etching process. The gate dielectric layer 110 and the gate electrode layer 112 may be etched by a dry etching process. The dry etching process may include using a fluorine-based etchant gas, such as $SF_6$, $C_xF_y$ (where x and y may be positive integers), $NF_3$, or a combination thereof. After the etching process, the top portion of the fin structure 104 may be exposed on opposite sides of the gate structure 108.

Next, a pair of spacers 114 is formed on opposite sidewalls of the gate structure 108, as shown in FIGS. 1 and 3A in accordance with some embodiments. The spacers 114 may be made of silicon oxide, silicon nitride, silicon oxynitride, and/or dielectric materials. The spacers 114 may be formed by a chemical vapor deposition (CVD) process, a spin-on-glass process, or another applicable process.

Afterwards, the top portion of the fin structure 104 exposed on opposite sides of the gate structure 108 may be removed in an etching process to form a recess (not shown). The etching process may be a dry etching process or a wet etching process. The fin structures 104 may be etched by a dry etching process. The dry etching process may include using a fluorine-based etchant gas, such as $SF_6$, $C_xF_y$ (where x and y may be positive integers), $NF_3$, or a combination thereof.

Next, a source/drain epitaxial structure 116 is formed in the recess over the fin structure 104 on opposite sides of the gate structure 108, as shown in FIGS. 1 and 3A in accordance with some embodiments. A strained material may be grown in the recess by an epitaxial (epi) process to form the source/drain epitaxial structure 116. In addition, the lattice constant of the strained material may be different from the lattice constant of the substrate 102. The source/drain epitaxial structure 116 may include Ge, SiGe, InAs, InGaAs, InSb, GaAs, GaSb, InAlP, InP, SiC, SiP, other applicable materials, or a combination thereof. The source/drain epitaxial structure 116 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

Afterwards, an etch stop layer 118 is formed over the spacers 114 and the source/drain epitaxial structure 116, as shown in FIGS. 1 and 3A in accordance with some embodiments. The etch stop layer 118 may include silicon nitride, silicon oxide, silicon oxynitride (SiON), other applicable materials, or a combination thereof. The etch stop layer 118 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

After the source/drain epitaxial structure 116 is formed, a first inter-layer dielectric (ILD) structure 120 is formed to cover the source/drain epitaxial structure 116 and fill up a space between the etch stop layer 118, as shown in FIGS. 1 and 3A in accordance with some embodiments. The first ILD structure 120 may surround the fin structure 104 and the source/drain epitaxial structure 116.

The first ILD structure 120 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD structure 120 may be formed by chemical vapor deposition (CVD), spin-on coating, or other applicable processes.

Afterwards, a planarizing process is performed on the first ILD structure 120 until the top surface of the gate structure 108 is exposed, as shown in FIGS. 1 and 3A in accordance with some embodiments. After the planarizing process, the top surface of the gate structure 108 may be substantially level with the top surfaces of the spacers 114 and the first ILD structure 120. The planarizing process may include a grinding process, a chemical mechanical polishing (CMP) process, an etching process, other applicable processes, or a combination thereof.

Next, a contact etch stop layer 122 is deposited over the gate structure 108, the spacer 114, the etch stop layer 118, and the first ILD structure 120, as shown in FIG. 3A in accordance with some embodiments. The processes for forming the contact etch stop layer 122 may be the same as, or similar to, those used to form the etch stop layer 118. For the purpose of brevity, the descriptions of these processes are not repeated herein.

Next, a second ILD structure 124 is blanketly formed over the contact etch stop layer 122, as shown in FIG. 3A in accordance with some embodiments. The processes for forming the second ILD structure 124 may be the same as, or similar to, those used to form the first ILD structure 120. For the purpose of brevity, the descriptions of these processes are not repeated herein.

Next, a hard mask layer 126 and an oxide layer 128 are deposited over the second ILD structure 124, as shown in FIG. 3A in accordance with some embodiments. The hard mask layer 126 and the oxide layer 128 may be mask layers for defining subsequently formed contact structures. The hard mask layer 126 may be made of TiN, Ti, Ta, TaN, Al, other applicable materials, an alloy thereof, or a combination thereof. The hard mask layer 126 and the oxide layer 128 may be formed by a chemical vapor deposition process (CVD), a physical vapor deposition process (PVD), (e.g., evaporation or sputter), an atomic layer deposition process (ALD), an electroplating process, other suitable processes, or a combination thereof.

Afterwards, a mask structure 130 is formed over the oxide layer 128, as shown in FIG. 3A in accordance with some embodiments. The mask structure 130 may be a multi-layer mask structure including a bottom layer, a middle layer, and a top layer. The bottom layer, the middle layer, and the top layer may be sequentially deposited over the oxide layer 128. The top layer may be made of a photoresist or photosensitive material, one or more other suitable materials, or a combination thereof. The bottom layer may be made of $C_xH_yO_z$ (where x, y, and z may be positive integers), the middle layer may be made of or includes $SiC_xH_yO_z$ (where x, y, and z may be positive integers), and the top layer may be made of or includes $C_xH_yO_z$ (where x, y, and z may be positive integers). The bottom layer, the middle layer, and the top layer may be deposited using a PVD process, a CVD process, a spin-on process, another applicable process, or a combination thereof. In addition, the mask structure may 130 also be a single layer, or it may include fewer than three layers, or more than three layers.

Figure 3B:
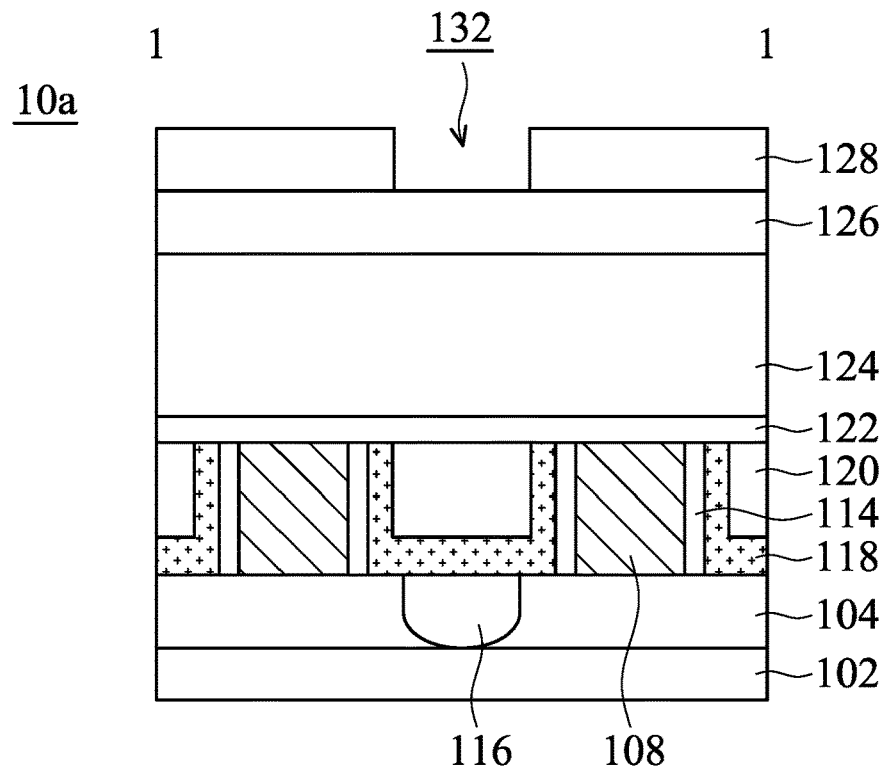

In some embodiments, the oxide layer 128 is patterned by the mask structure 130, as shown in FIG. 3B in accordance with some embodiments. As a result, opening 132 may be formed in the oxide layer 128. The patterned mask structure 130 may be removed during the patterning of the oxide layer 128. The opening 132 may partially expose the hard mask layer 126. The oxide layer 128 may be patterned by a photolithography process, which may include exposure, developing, rinsing, and baking processes. The oxide layer 128 may be etched by a dry etching process. After the etching process, a cleaning process using $DIO_3$ and SC1 solutions may be performed.

Figure 3C:
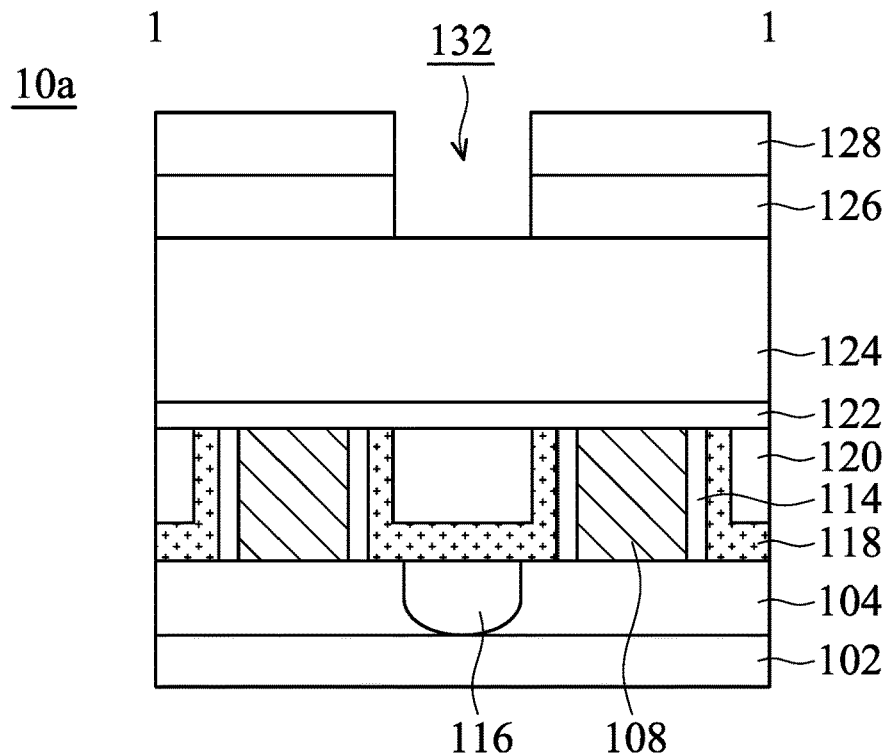

The patterned oxide layer 128 is then used as an etch mask to pattern underlying layers, such as the hard mask layer 126. As a result, the opening 132 are transferred into the hard mask layer 126, as shown in FIG. 3C in accordance with some embodiments. After the hard mask layer 126 is patterned, a wet clean process is performed to remove the residue of the etching process. The wet clean process may use DI, $H_2O_2$, $H_2O$, HF, $H_3PO_4$, HCl, $CH_2CHOOH$, $H_2SO_4$, $HNO_3$, other applicable chemicals, or a combination thereof to remove the residue of the etching process.

Figure 3D:
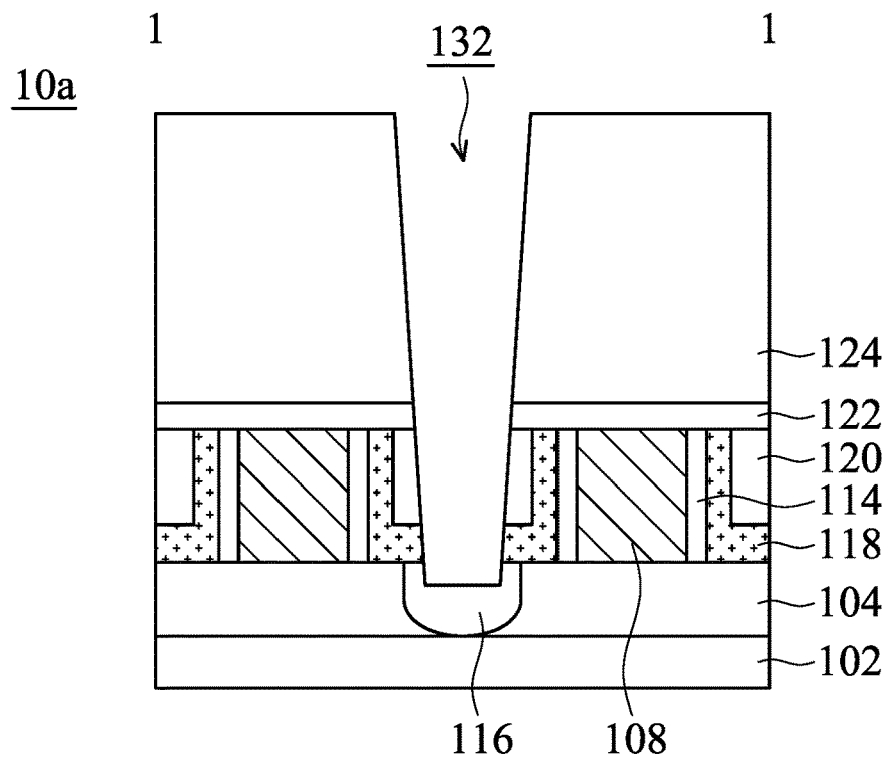

Afterwards, a patterning and an etching process are performed to transfer the opening 132 in the second ILD structure 124 and the first ILD structure 120 by using patterned oxide layer 128 and hard mask layer 126 as a mask, as shown in FIG. 3D in accordance with some embodiments. The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process. A portion of the source/drain epitaxial structure 116 may be exposed from the opening 132.

Figure 3E:
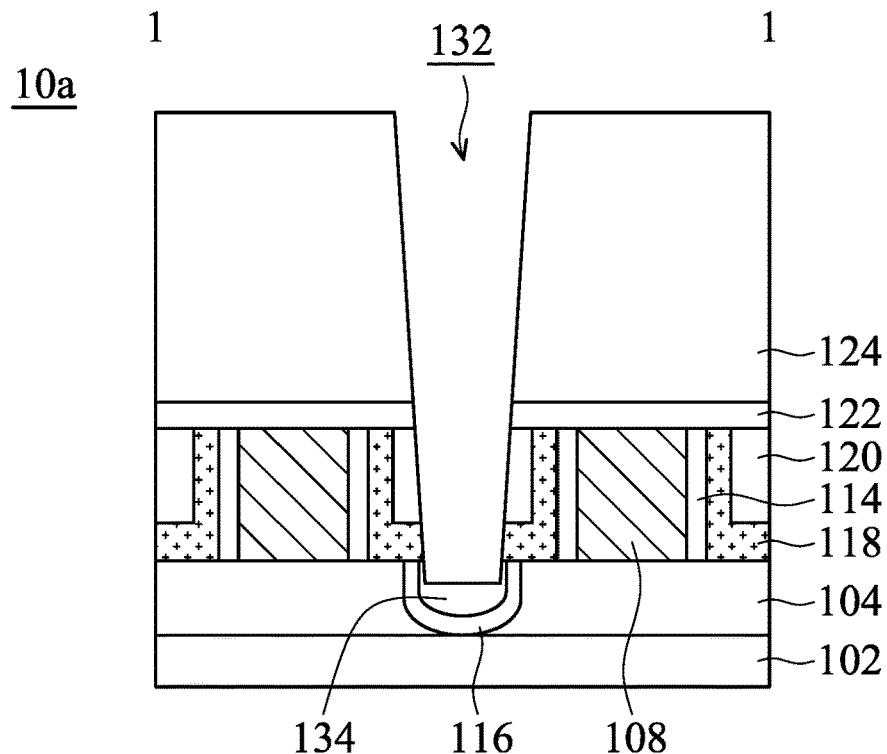

Next, an implantation process is performed over the source/drain epitaxial structure 116 and a source/drain doping region 134 is formed in the source/drain epitaxial structure 116, as shown in FIG. 3E in accordance with some embodiments. The source/drain doping region 134 may help to reduce the resistance of the source/drain epitaxial structure 116. The dopant implanted in p-type source/drain epitaxial structure 116 may include boron, indium, or gallium. The dopant implanted in n-type source/drain epitaxial structure 116 may include phosphorus or arsenic.

Figure 3F:
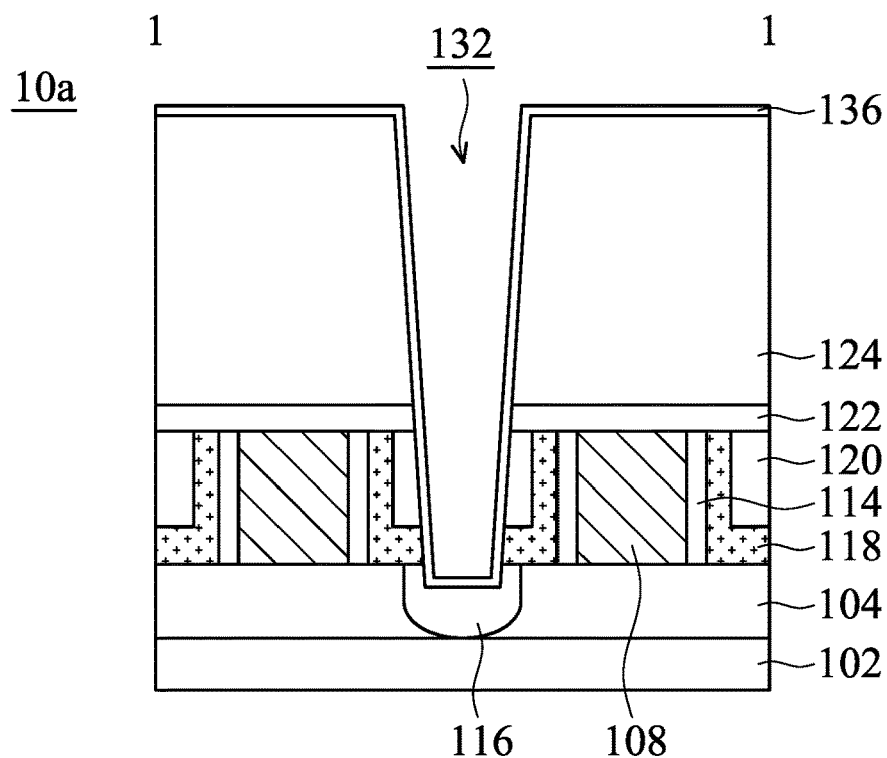

Next, a first liner layer 136 is conformally deposited over the bottom surface and the sidewalls of the opening 132 and over the top surface of the second ILD structure 124, as shown in FIG. 3F in accordance with some embodiments. The first liner layer 136 may include nitride. The first liner layer 136 may help to avoid leakage between the gate structure 108 and contact structure which may be subsequently formed in the opening 132. The first liner layer 136 may be formed by a chemical vapor deposition process (CVD) (such as PECVD), a physical vapor deposition process (PVD), an atomic layer deposition process (ALD), other suitable processes, or a combination thereof.

Figure 3G:
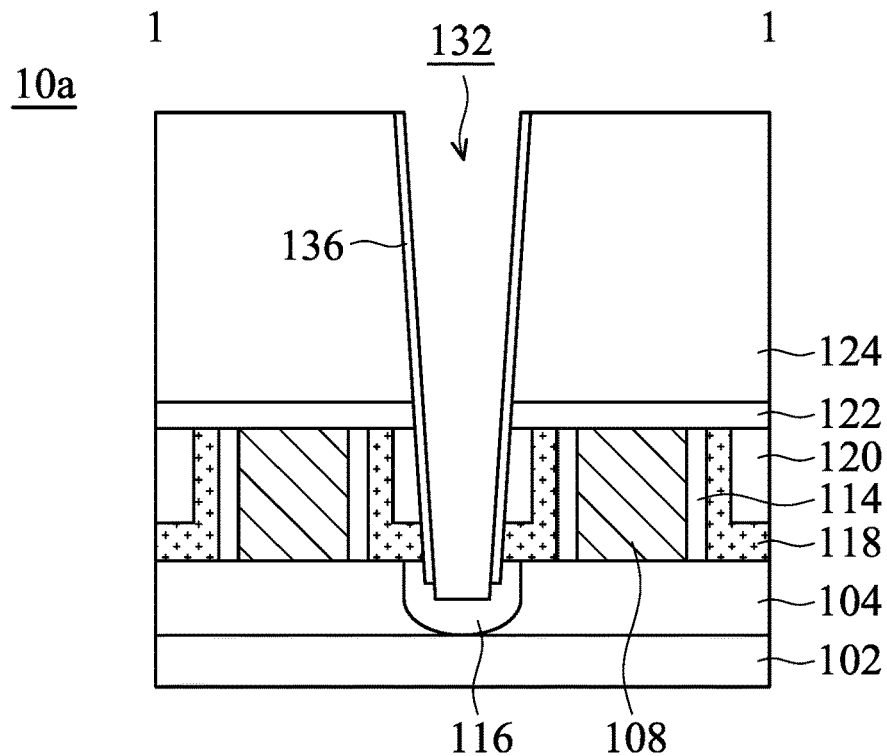

Later, the first liner layer 136 over the bottom surface of the opening 132 and the top surface of the second ILD structure 124 is removed, as shown in FIG. 3G in accordance with some embodiments. In some embodiments as shown in FIG. 3G, the source/drain epitaxial structure 116 is further recessed during removing the first liner layer 136 over the bottom surface of the opening 132, and the opening 132 is therefore enlarged. The first liner layer 136 and source/drain epitaxial structure 116 may be etched by a dry etching process.

Next, an implantation process is performed to implant dopant in the source/drain epitaxial structure 116 (not shown). The dopant used in the implantation process may include N, C, Ne, Ar, Kr, Xe, Rn, B, $F_2$, $BF_2$, In, Sb. With the implantation process, the defect and the resistance may be decreased, and the thermal stability of subsequent silicide formation may be improved.

Figure 3H:
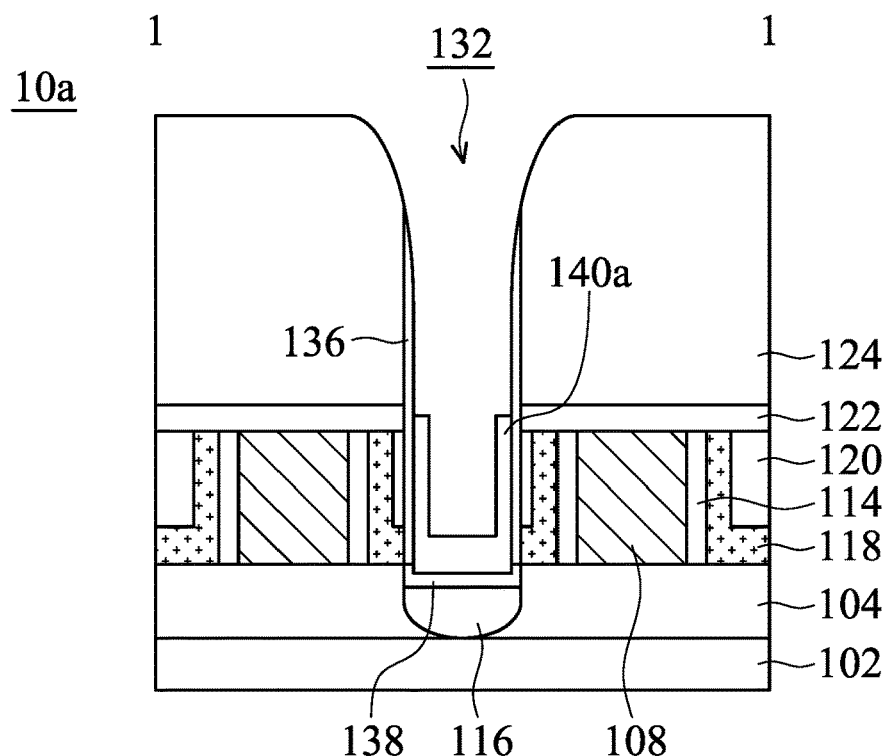

Next, a metal semiconductor compound layer 138 may be formed over the source/drain epitaxial structure 116, as shown in FIG. 3H in accordance with some embodiments. The metal semiconductor compound layer 138 may reduce the contact resistance between the source/drain epitaxial structure 116 and the subsequently formed contact structure over the source/drain epitaxial structure 116. The metal semiconductor compound layer may be made of titanium silicide ($TiSi_2$), nickel silicide (NiSi), cobalt silicide (CoSi), or other suitable low-resistance materials. The metal semiconductor compound layer 138 may be formed over the source/drain epitaxial structure 116 by forming a metal layer over the source/drain epitaxial structure 116 first. The metal layer may react with the source/drain epitaxial structure 116 in an annealing process and a metal semiconductor compound layer may be produced. Afterwards, the unreacted metal layer may be removed in an etching process and the metal semiconductor compound layer may be left.

Next, a first barrier layer 140a is conformally formed over the bottom surface and the sidewalls of the opening 132. Afterwards, the first barrier layer 140a is etched back, as shown in FIG. 3H in accordance with some embodiments. In some embodiments as shown in FIG. 3H, the first barrier layer 140a remains over the bottom surface of the opening 132 and covers a portion of the first liner layer 136. In some embodiments, the top surface of the first barrier layer 140a is higher than the top surface of the gate structure 108 and lower than the top surface of the contact etch stop layer 122. The first barrier layer 140a may be formed before filling the conductive material in the opening 144 to prevent the conductive material from diffusing out. The first barrier layer 140a may also serve as an adhesive or glue layer. The material of the first barrier layer 140a may be TiN, Ti, other applicable materials, or a combination thereof. The first barrier layer 140a may be formed by depositing the barrier layer materials by a physical vapor deposition process (PVD) (e.g., evaporation or sputtering), an atomic layer deposition process (ALD), an electroplating process, other applicable processes, or a combination thereof.

Figure 3I:
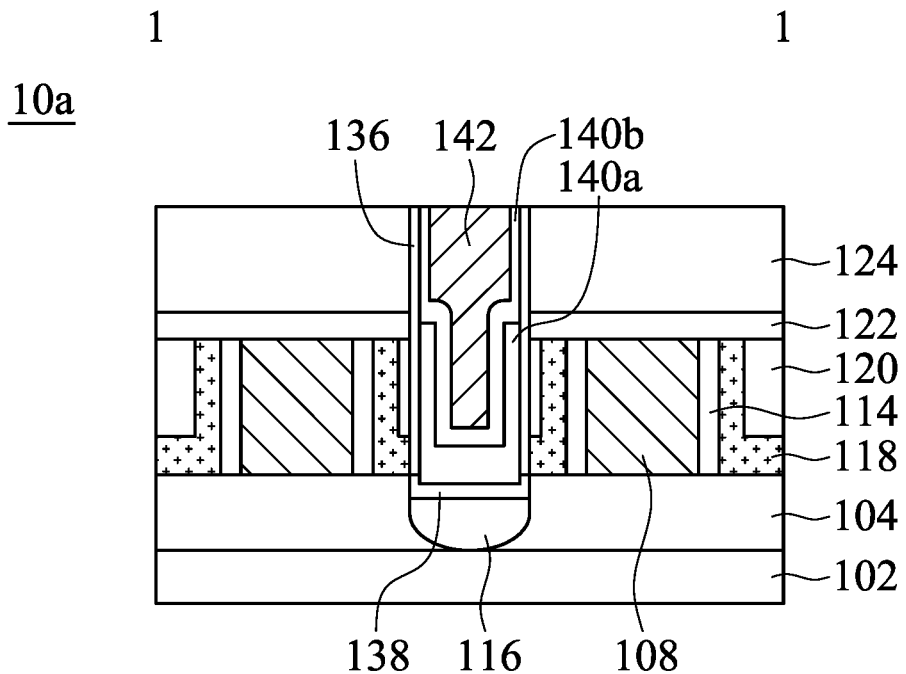

Next, a second barrier layer 140b is conformally formed over the bottom surface and the sidewalls of the opening 132, and the top surface of the second ILD structure 124, as shown in FIG. 3I in accordance with some embodiments. The processes for forming the second barrier layer 140b may be the same as, or similar to, those used to form the first barrier layer 140a. For the purpose of brevity, the descriptions of these processes are not repeated herein. In some embodiments, the first barrier layer 140a and the second barrier layer 140b are made of the same material.

Afterwards, a contact structure 142 is formed into the opening 132 over the source/drain epitaxial structure 116, as shown in FIG. 3I in accordance with some embodiments. The contact structure 142 may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The contact structure 142 may be formed by a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the contact structure 142, and then a planarization process such as a chemical mechanical polishing (CMP) process or an etch back process is optionally performed to remove excess conductive materials. After the planarization process, the top surface of the contact structure 142 may be level with the top surface of the second ILD structure 124.

Figure 3J:
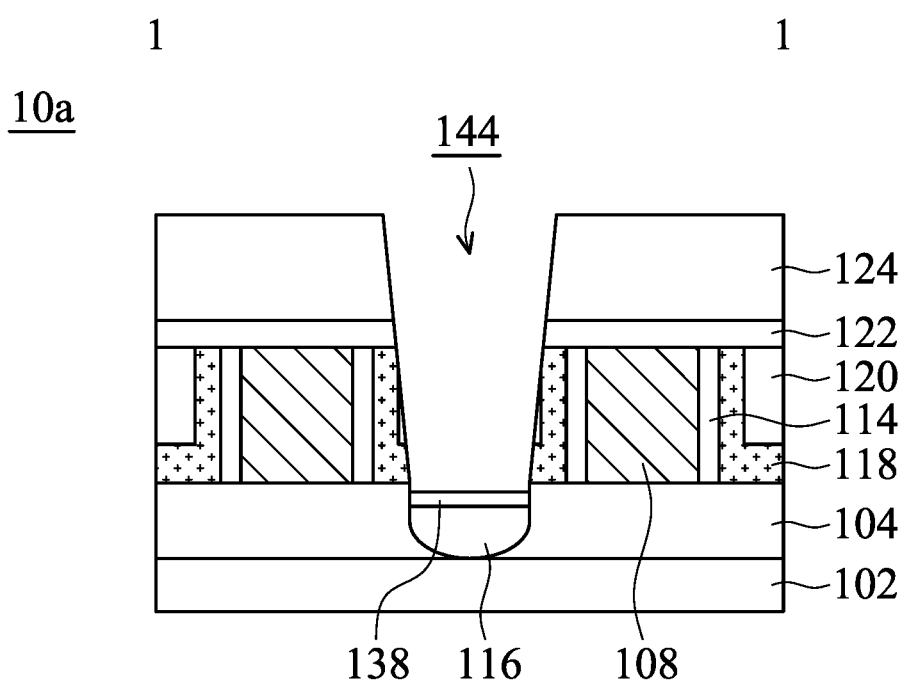

Next, the contact structure 142 is patterned and a portion of the contact structure 142, the first barrier layer 140a, the second barrier layer 140b, and the first liner layer 136 are removed, and a recess 144 is formed, as shown in FIG. 3J in accordance with some embodiments. The recess 144 may be formed by an etching process such as a dry etching process or a wet etching process. The source/drain epitaxial structure 116 may be exposed from the recess 144.

Figure 3K:
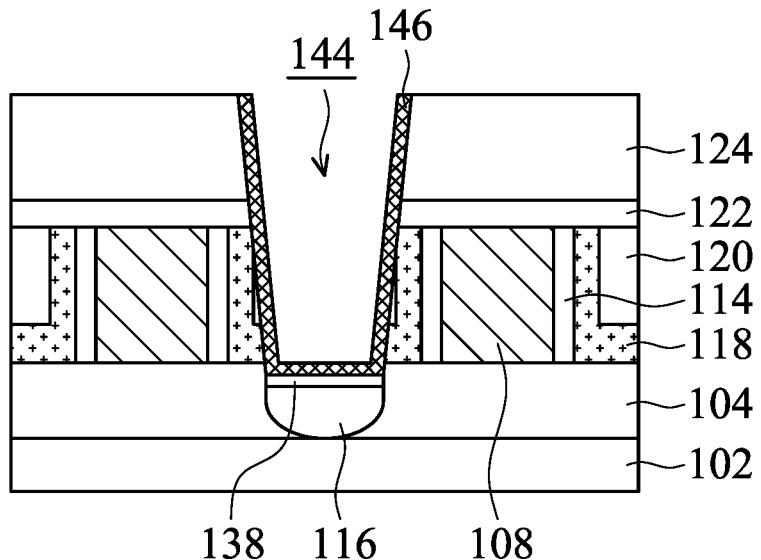

Afterwards, a second liner layer 146 is conformally formed over the bottom surface and the sidewalls of the recess 144, as shown in FIG. 3K in accordance with some embodiments. In some embodiments, the second liner layer 146 is made of silicon. The second liner layer 146 may be formed by a chemical vapor deposition process (CVD) (such as PECVD), a physical vapor deposition process (PVD), an atomic layer deposition process (ALD), other suitable processes, or a combination thereof.

Figure 3L:
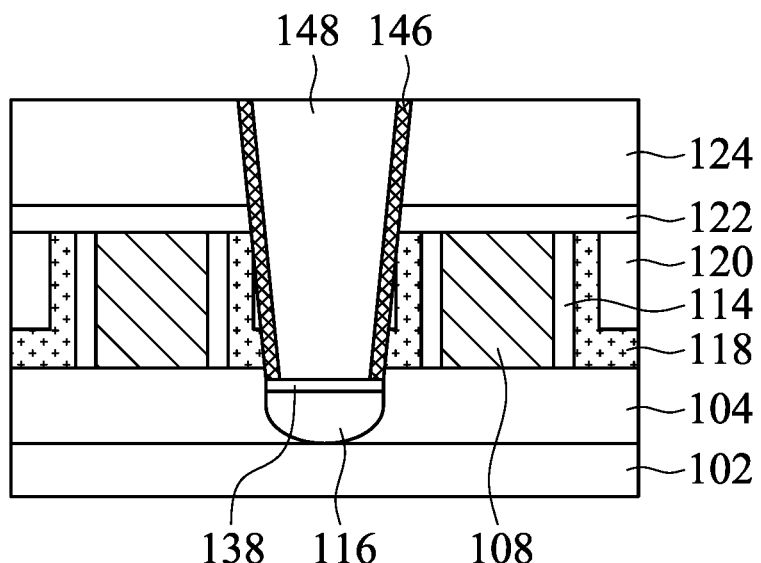

Next, the second liner layer 146 over the bottom surface of the recess 144 is optionally removed, as shown in FIG. 3L in accordance with some embodiments. The source/drain epitaxial structure 116 is exposed from the recess 144. The second liner layer 146 may be removed by a dry etching process.

Later, a contact blocking structure 148 is filled into the recess 144, as shown in FIG. 3L in accordance with some embodiments. Therefore, the contact blocking structure 148 is formed over the source/drain epitaxial structure 116. In some embodiments, the contact blocking structure 148 is made of oxide. The contact blocking structure 148 may be formed by a chemical vapor deposition process (CVD), a physical vapor deposition process (PVD), an atomic layer deposition process (ALD), other suitable processes, or a combination thereof, and then optionally performing a chemical mechanical polishing (CMP) process or an etching back process to remove excess contact blocking materials.

Figure 3M:
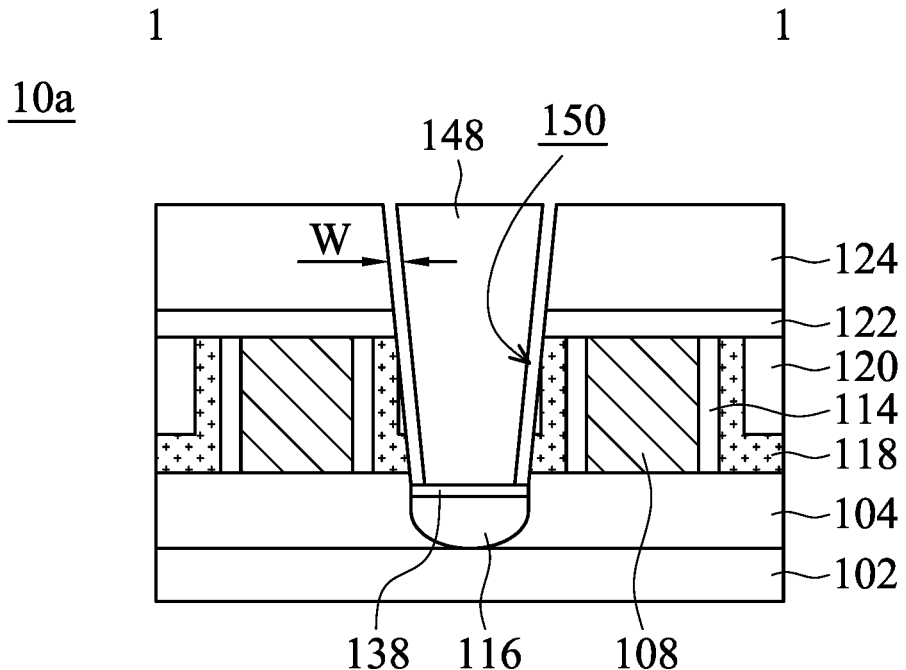
Figures 1, 3N:
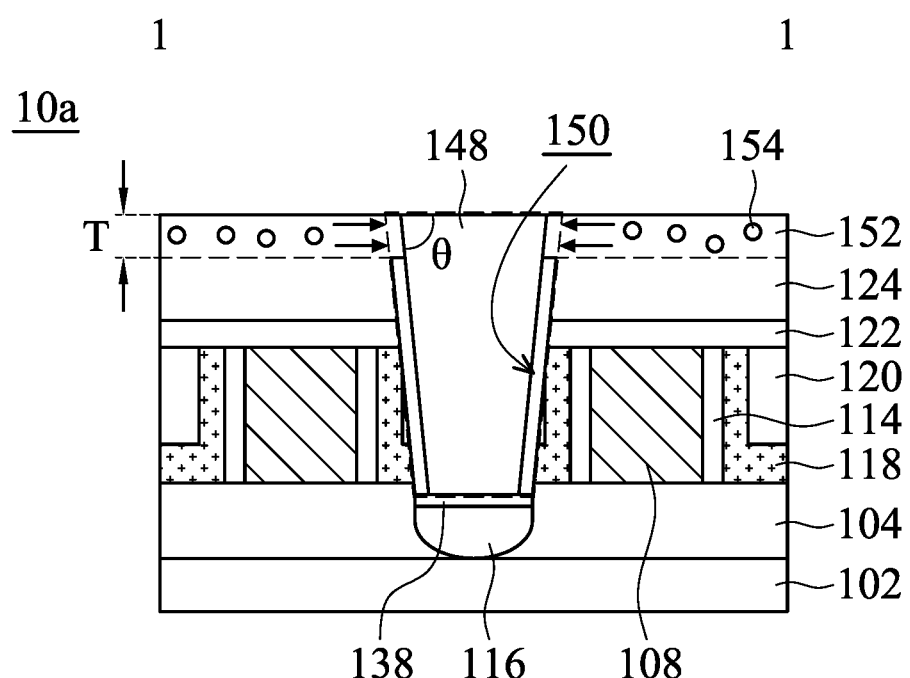
Figures 2, 3N:
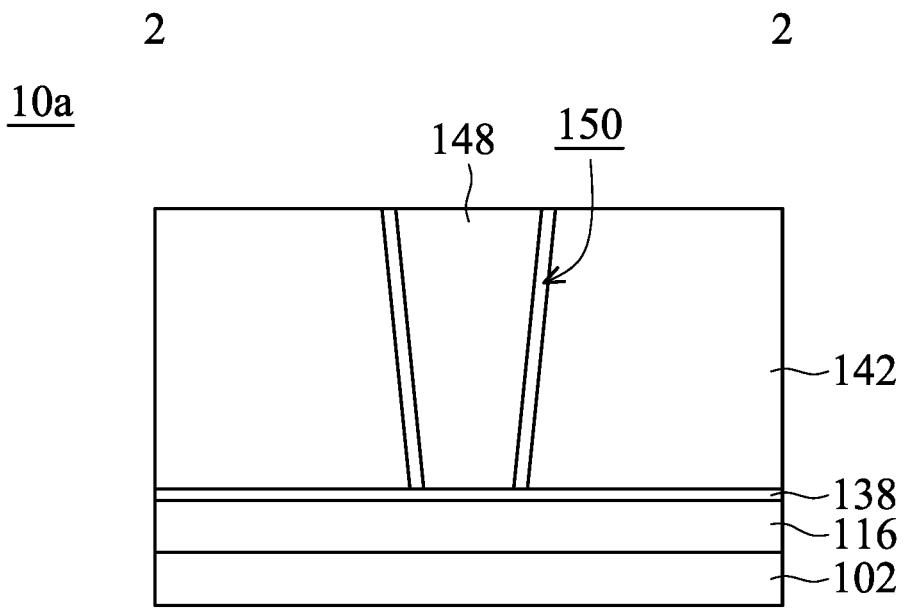

Next, the second liner layer 146 surrounding the contact blocking structure 148 is removed, and an air gap 150 is formed over the sidewalls of the contact blocking structure 148, as shown in FIG. 3M in accordance with some embodiments. The air gap 150 surrounding the contact blocking structure 148 may help to reduce parasitic capacitance. The second liner layer 146 may be removed by an etching process, which may be a dry etching process or a wet etching process. The wet etching process may be performed in wet etching etchant including diluted hydrofluoric acid (DHF), potassium hydroxide (KOH), ammonia, hydrofluoric acid (HF), nitric acid ($HNO_3$), and/or acetic acid ($CH_3COOH$), other suitable wet etching etchant, or a combination thereof.

As shown in FIG. 3M, the air gap 150 has a width W in a range of about 0.1 nm to about 15 nm. If the width W is too great, it may be too difficult to seal the air gap 150 in subsequent process. If the width W is too less, the parasitic capacitance may be too great. In addition, the width W of the air gap 150 may be determined by the thickness of the second liner layer 146. Therefore, it may be easy to modify the width W and it may provide more flexibility to modify the width W of the air gap 150.

Next, an implantation process is performed to form a doping region 152 in the second ILD structure 124, as shown in FIG. 3N-1 in accordance with some embodiments. In some embodiments, the dopant 154 of the doping region 152 includes Ge. With greater lattice constant, the stress caused by the dopant 154 may help to expand the doping region 152, and the air gap 150 may be sealed by the expanded doping region 152. By forming the doping region 152 in the top portion of the second ILD structure 124, the top portion of the air gap 150 is sealed. In some embodiments as shown in FIG. 3N-1, the doping region 152 in the second ILD structure 124 is over the air gap 150. With the doping region 152 sealing the air gap 150, the contact blocking structure 148 may be resistant to the following etching process. As shown in FIG. 3N-1, the air gap 150 protrudes upward into the second ILD structure 124. In addition, the lower portion of the contact blocking structure 148 is surrounded by the air gap 150, and the air gap 150 is covered by the top portion of the second ILD structure 124.

In some embodiments as shown in FIG. 3N-1, since the air gap 150 is sealed by the doping region 152 in the second ILD structure 124, the doping region 152 in the second ILD structure 124 is in direct contact with the contact blocking structure 148. In some embodiments as shown in FIG. 3N-1, the air gap 150 is formed through the contact etch stop layer 122 and the first ILD structure 120.

In some embodiments as shown in FIG. 3N-1, the thickness T of the doping region 152 is in a range of about 0.1 nm to about 20 nm. The thickness T of the doping region 152 may be determined by the implant energy of forming the doping region 152. If the thickness T of the doping region 152 is too thick, the air gap 150 may be too short, and the capacitance may be too great. If the thickness T of the doping region 152 is too thin, it may not provide enough resistance for following etching process. In some embodiments as shown in FIG. 3N-1, the top surface of the doping region 152 is level with the top surface of the second ILD structure 124.

In some embodiments as shown in FIG. 3N-1, the top surface of the contact blocking structure 148 is wider than the bottom surface of the contact blocking structure 148. In addition, the angle θ between the top surface and the sidewall of the contact blocking structure 148 is from about 80° to about 90°. If the angle θ is too great, it may be difficult to form the contact blocking structure 150 over the source/ drain epitaxial structure 116. If the angle θ is too less, the contact structures 142 may not be blocked effectively.

FIG. 3N-2 shows a cross-sectional representation taken along line 2-2 in FIG. 2. As shown in FIG. 3N-2, the contact structure 142 and the contact blocking structure 148 are separated by the air gap 150. Therefore, the parasitic capacitance between contact structures 142 may be reduced.

With an air gap 150 formed surrounding the contact blocking structure 148, the parasitic capacitance between the contact structures 142 may be reduced, and the circuit speed may be boosted. In addition, the width of the air gap 150 may be easily modified by tuning the thickness of the second liner layer 146. Therefore, it may be easier to improve device performance and yield at the same time. The air gap 150 may be sealed by implanting dopant 154 with greater lattice constant in the top portion of the second ILD structure 124.

Figure 4:
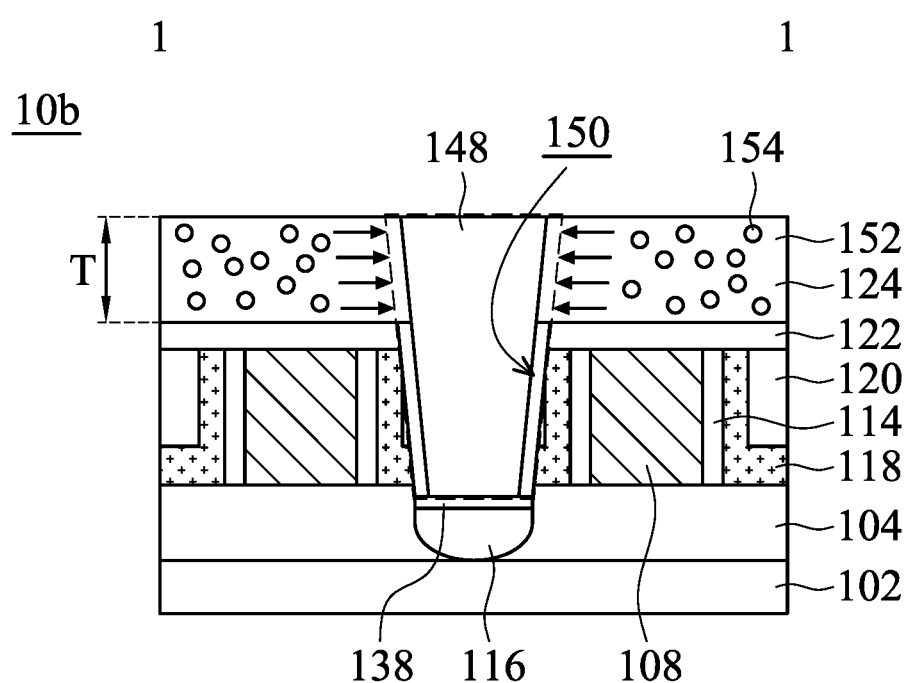
FIG. 4 is a cross-sectional representation of a modified semiconductor structure, in accordance with some embodiments of the disclosure.

Many variations and/or modifications may be made to the embodiments of the disclosure. FIG. 4 is a cross-sectional representation of a modified semiconductor structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4 in accordance with some embodiments, the bottom surface of the doping region 152 is level with the top surface of the contact etch stop layer 122.

The thickness T of the doping region 152 may be determined by the implant energy of the implantation process of the dopant 154. Therefore, once the second ILD structure 124 is doped by the dopant 154 completely, the bottom surface of the doping region 152 is level with the bottom surface of the second ILD structure 124. Moreover, the air gap 150 is sealed by the whole second ILD structure 124.

With an air gap 150 formed surrounding the contact blocking structure 148, the parasitic capacitance between the contact structures 142 may be reduced, and the circuit speed may be boosted. In addition, the width of the air gap 150 may be easily modified by tuning the thickness of the second liner layer 146. Therefore, it may be easier to improve device performance and yield at the same time. The air gap 150 may be sealed by implanting dopant 154 with greater lattice constant in the top portion of the second ILD structure 124. The thickness T of the doping region 152 may be determined by the implant energy of the implantation process of the dopant 154.

Figure 5A:
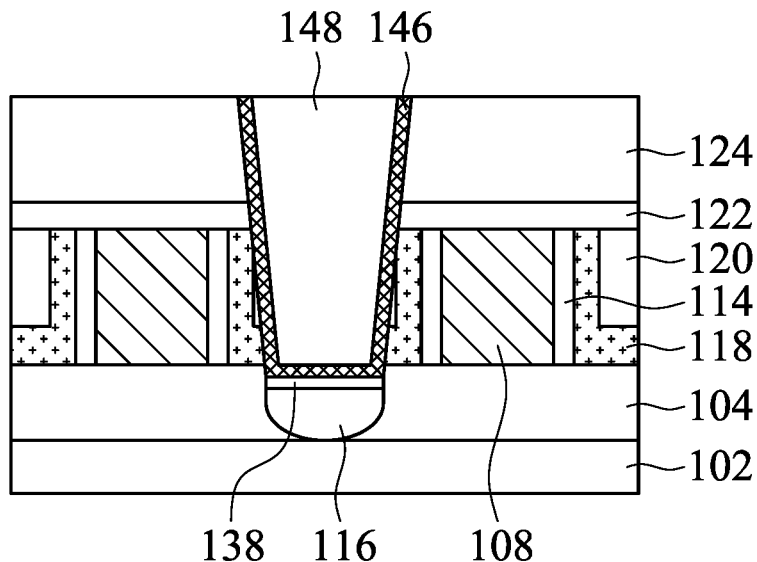
FIGS. 5A-5B are cross-sectional representations of various stages of forming a modified semiconductor structure, in accordance with some embodiments of the disclosure.
Figure 5B:
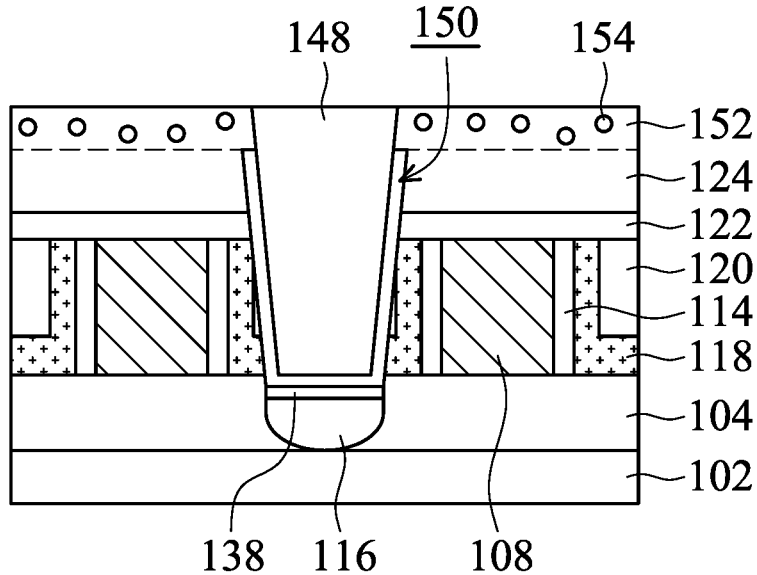

Many variations and/or modifications may be made to the embodiments of the disclosure. FIGS. 5A-5B are cross-sectional representations of a stage of forming a modified semiconductor structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5A in accordance with some embodiments, the second liner layer 146 over the bottom surface of the recess 144 remains, and the contact blocking structure 148 is formed over the second liner layer 146.

In some embodiments as shown in FIG. 5A, after conformally forming the second liner layer 146 over the recess 144, the contact blocking structure 148 is formed in the recess 144. Therefore, the contact blocking structure 148 and the source/drain epitaxial structure 116 are separated by the second liner layer 146.

Next, the second liner layer 146 below the bottom surface and over the sidewalls of the contact blocking structure 148 is removed, and the air gap 150 is formed below the bottom surface and over the sidewalls of the contact blocking structure 148, as shown in FIG. 5B in accordance with some embodiments. Afterwards, the top portion of the air gap 150 may be sealed by forming a doping region 152 in the second ILD structure 152. As shown in FIG. 5B, the bottom portion of the contact blocking structure 148 is surrounded by the air gap 150, and the parasitic capacitance may be further reduced.

With an air gap 150 formed surrounding the contact blocking structure 148, the parasitic capacitance between the contact structures 142 may be reduced, and the circuit speed may be boosted. In addition, the width of the air gap 150 may be easily modified by tuning the thickness of the second liner layer 146. Therefore, it may be easier to improve device performance and yield at the same time. The air gap 150 may be sealed by implanting dopant 154 with greater lattice constant in the top portion of the second ILD structure 124. In addition, with the air gap forming between the contact blocking structure 148 and the source/drain epitaxial structure 116, the parasitic capacitance may be further reduced.

Figure 6:
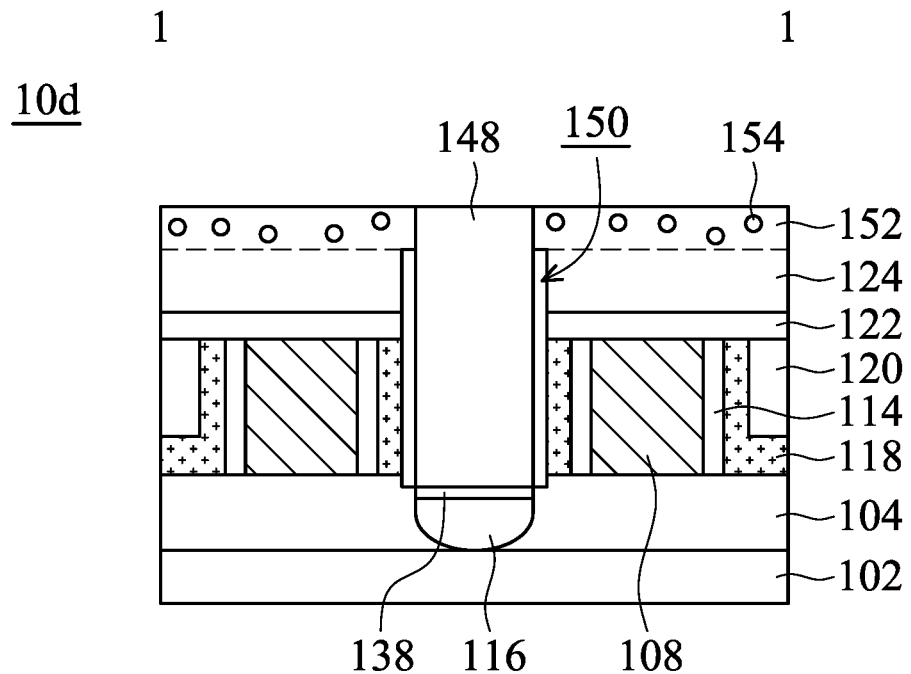
FIG. 6 is a cross-sectional representation of a modified semiconductor structure, in accordance with some embodiments of the disclosure.

Many variations and/or modifications may be made to the embodiments of the disclosure. FIG. 6 is a cross-sectional representation of a modified semiconductor structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 6 in accordance with some embodiments, the sidewalls of the air gap 150 are perpendicular to the bottom surface of the recess 144.

Figure 7:
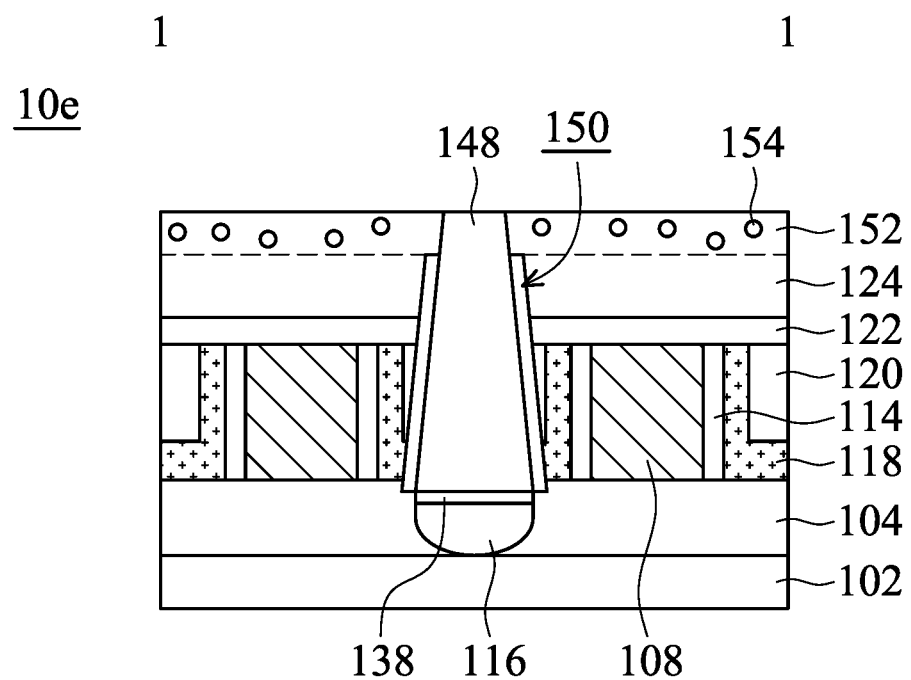
FIG. 7 is a cross-sectional representation of a modified semiconductor structure, in accordance with some embodiments of the disclosure.

Many variations and/or modifications may be made to the embodiments of the disclosure. FIG. 7 is a cross-sectional representation of a modified semiconductor structure 10e, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 7 in accordance with some embodiments, the area of the top portion of the contact blocking structure 148 is less than the area of the bottom portion of the contact blocking structure 148.

By tuning the parameters of the etching process to remove the contact structure 142, the profile of the recess 144 may be modified, and the profile of the contact blocking structure 148 may also be modified. With various profiles of the contact blocking structure 148, there may be more flexibility for device performance and yield improvement.

With an air gap 150 formed surrounding the contact blocking structure 148, the parasitic capacitance between the contact structures 142 may be reduced, and the circuit speed may be boosted. In addition, the width of the air gap 150 may be easily modified by tuning the thickness of the second liner layer 146. Therefore, it may be easier to improve device performance and yield at the same time. The air gap 150 may be sealed by implanting dopant 154 with greater lattice constant in the top portion of the second ILD structure 124. In addition, with various profiles of the contact blocking structure 148 with air gap 150 forming over the sidewalls, there may be more flexibility for process window.

As described previously, the air gap 150 surrounding the contact blocking structure 148 may lower the parasitic capacitance. The air gap 150 separates the contact structure 142 and the contact blocking structure 148. The width W of the air gap 150 is determined by the thickness of the second liner layer 146. It may provide flexibility for device performance and yield improvement. The air gap 150 is sealed by forming a doping region 152 above the air gap 150. By doping dopant 154 with greater lattice constant, the stress caused by the dopant 154 may help to seal the air gap 150. The thickness of the doping region 152 may be determined by the implant energy of the dopant 154. In some embodiments as shown in FIG. 5B, the air gap 150 is also formed below the contact blocking structure 148, and the capacitance may be further lowered. In some embodiments as shown in FIGS. 6 and 7, different profiles of the contact blocking structure 148 are provided, and there may be more flexibility for process window.

Embodiments of a semiconductor structure and a method for forming the same are provided. The method for forming the semiconductor structure may include forming an air gap between the contact structure and the contact blocking structure. With the air gap, the capacitance between the contact structures may be reduced. The device performance and yield may also be improved.

In some embodiments, a semiconductor structure is provided. The semiconductor structure includes a fin structure formed over a substrate. The semiconductor structure also includes a gate structure formed across the fin structure. The semiconductor structure also includes source/drain epitaxial structures formed on opposite sides of the gate structure. The semiconductor structure also includes an inter-layer dielectric (ILD) structure formed over the gate structure. The semiconductor structure also includes a contact blocking structure formed through the ILD structure over the source/drain epitaxial structure. A lower portion of the contact blocking structure is surrounded by an air gap, and the air gap is covered by a portion of the ILD structure.

In some embodiments, a semiconductor structure is provided. The semiconductor structure includes a fin structure formed over a substrate. The semiconductor structure also includes a gate structure formed across the fin structure. The semiconductor structure also includes a source/drain epitaxial structure formed over the fin structure on opposite sides of the gate structure. The semiconductor structure also includes a contact structure formed over the source/drain epitaxial structure. The semiconductor structure also includes a contact blocking structure formed in the contact structure. The contact blocking structure is separated from the contact structure by an air gap.

In some embodiments, a method for forming a semiconductor structure is provided. The method for forming a semiconductor structure includes forming a fin structure over a substrate. The method for forming a semiconductor structure also includes forming a gate structure across the fin structure. The method for forming a semiconductor structure also includes growing a source/drain epitaxial structure beside the gate structure. The method for forming a semiconductor structure also includes depositing an ILD structure over the gate structure. The method for forming a semiconductor structure also includes forming a contact structure through the ILD structure over the source/drain epitaxial structure. The method for forming a semiconductor structure also includes removing a portion of the contact structure to form a recess over the source/drain epitaxial structure. The method for forming a semiconductor structure also includes forming a contact blocking structure in the recess with an air gap over sidewalls of the contact blocking structure. The method for forming a semiconductor structure also includes sealing the top portion of the air gap.

In some embodiments, a semiconductor structure is provided. The semiconductor structure includes a gate structure formed over a substrate. The semiconductor structure also includes a source/drain epitaxial structure adjacent to the gate structure. The semiconductor structure also includes a contact etch stop layer formed over the gate structure. The semiconductor structure also includes an inter-layer dielectric (ILD) structure formed over the contact etch stop layer and includes a doping region. The semiconductor structure also includes a contact blocking structure formed through the ILD structure and the contact etch stop layer over the source/drain epitaxial structure. The contact blocking structure is in contact with the doping region and spaced apart from the contact etch stop layer by an air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a fin structure formed over a substrate;
    a gate structure formed across the fin structure;
    source/drain epitaxial structures formed on opposite sides of the gate structure;
    an inter-layer dielectric (ILD) structure formed over the gate structure; and
    a contact blocking structure formed through the ILD structure over the source/drain epitaxial structure,
    wherein a lower portion of the contact blocking structure is surrounded by an air gap, and the air gap is covered by a portion of the ILD structure.

2. The semiconductor structure as claimed in claim 1, further comprising:
    a doping region formed in the ILD structure over the air gap.

3. The semiconductor structure as claimed in claim 1, wherein a dopant in the doping region comprises Ge.

4. The semiconductor structure as claimed in claim 1, wherein a top surface of the contact blocking structure is wider than a bottom surface of the contact blocking structure.

5. The semiconductor structure as claimed in claim 1, wherein the air gap protrudes upward into the ILD structure.

6. The semiconductor structure as claimed in claim 1, wherein the air gap is below a bottom surface of the contact blocking structure.

7. The semiconductor structure as claimed in claim 1, further comprising:
    a contact structure formed over the source/drain epitaxial structure;
    wherein the contact structure and the contact blocking structure are separated by the air gap.

8. A semiconductor structure, comprising:
    a fin structure formed over a substrate;
    a gate structure formed across the fin structure;

a source/drain epitaxial structure formed over the fin structure on opposite sides of the gate structure;

a contact structure formed over the source/drain epitaxial structure;

a contact blocking structure formed in the contact structure, wherein the contact blocking structure is separated from the contact structure by an air gap.

9. The semiconductor structure as claimed in claim 8, further comprising:

an ILD structure formed over the gate structure, wherein a portion of the ILD structure is in direct contact with the contact blocking structure.

10. The semiconductor structure as claimed in claim 8, further comprising:

a doping region formed in a top portion of the ILD structure, wherein the doping region is in direct contact with the contact blocking structure.

11. The semiconductor structure as claimed in claim 10, further comprising:

an etch stop layer deposited over the gate structure, wherein the air gap is formed through the etch stop layer.

12. The semiconductor structure as claimed in claim 11, wherein a bottom surface of the doping region is level with a top surface of an etch stop layer.

13. The semiconductor structure as claimed in claim 8, wherein an area of a top portion of the contact blocking structure is less than an area of a bottom portion of the contact blocking structure.

14. The semiconductor structure as claimed in claim 8, wherein the contact blocking structure is separated from the fin structure by the air gap.

15. A semiconductor structure, comprising:

a gate structure formed over a substrate;

a source/drain epitaxial structure adjacent to the gate structure;

a contact etch stop layer formed over the gate structure;

an inter-layer dielectric (ILD) structure formed over the contact etch stop layer and comprising a doping region; and a contact blocking structure formed through the ILD structure and the contact etch stop layer over the source/drain epitaxial structure, wherein the contact blocking structure is in contact with the doping region and spaced apart from the contact etch stop layer by an air gap.

16. The semiconductor structure as claimed in claim 15, wherein the doping region is in contact with the contact etch stop layer.

17. The semiconductor structure as claimed in claim 15, wherein the contact blocking structure is spaced apart from a bottom portion of the ILD structure by the air gap.

18. The semiconductor structure as claimed in claim 17, wherein a Ge concentration of the doping region is greater than a Ge concentration of the bottom portion of the ILD structure.

19. The semiconductor structure as claimed in claim 15, further comprising a metal semiconductor compound layer over the source/drain epitaxial structure, wherein the contact blocking structure is spaced apart from the metal semiconductor compound layer by the air gap.

20. The semiconductor structure as claimed in claim 15, wherein the air gap is formed over an edge of the source/drain epitaxial structure.

* * * * *